US008426863B2

(12) United States Patent  
Park et al.

(10) Patent No.: US 8,426,863 B2  
(45) Date of Patent: Apr. 23, 2013

(54) THIN FILM TRANSISTOR; METHOD OF MANUFACTURING SAME; AND ORGANIC LIGHT EMITTING DEVICE INCLUDING THE THIN FILM TRANSISTOR

(75) Inventors: Yong-Hwan Park, Seoul (KR); Byoung-Seong Jeong, Yongin-si (KR); Joon-Hoo Choi, Seoul (KR); Sang-Ho Moon, Seoul (KR)

(73) Assignee: Samsung Display Co., Ltd. (KR)

( * ) Notice: Subject to any disclaimer, the term of this patent is extended or adjusted under 35 U.S.C. 154(b) by 112 days.

(21) Appl. No.: 12/420,769

(22) Filed: Apr. 8, 2009

(65) Prior Publication Data  
US 2010/0090222 A1 Apr. 15, 2010

(30) Foreign Application Priority Data  
Oct. 15, 2008 (KR) .......................... 10-2008-0101055

(51) Int. Cl.  
*H01L 29/786* (2006.01)

(52) U.S. Cl.  
USPC .......... 257/66; 257/61; 257/72; 257/E21.412; 257/E29.273

(58) Field of Classification Search ................... 257/66, 257/61, 72, E21.412, E29.273  
See application file for complete search history.

(56) References Cited

U.S. PATENT DOCUMENTS 5,994,717 A * 11/1999 Igarashi et al. ................. 257/59  
2009/0075460 A1* 3/2009 Ohtani et al. ................. 438/487

* cited by examiner

*Primary Examiner* — Long Pham  
(74) *Attorney, Agent, or Firm* — Innovation Counsel LLP

(57) ABSTRACT

A thin film transistor according to one or more embodiments of the present invention includes: an insulation substrate; a gate electrode formed on the substrate; a gate insulating layer formed on the gate electrode; a semiconductor formed on the gate insulating layer and having a pair of openings facing each other; ohmic contact layers formed in the openings and including a conductive impurity; and a source electrode and a drain electrode in contact with their respective ohmic contact layers. An organic light emitting device in accordance with an embodiment includes: a first signal line and a second signal line intersecting each other on an insulation substrate; a switching thin film transistor connected to the first signal line and the second signal line; a driving thin film transistor connected to the switching thin film transistor; and a light emitting diode (LED) connected to the driving thin film transistor.

3 Claims, 9 Drawing Sheets

THIN FILM TRANSISTOR; METHOD OF MANUFACTURING SAME; AND ORGANIC LIGHT EMITTING DEVICE INCLUDING THE THIN FILM TRANSISTOR

CROSS-REFERENCE TO RELATED APPLICATIONS

This application claims priority to and the benefit of Korean Patent Application No. 10-2008-0101055 filed in the Korean Intellectual Property Office on Oct. 15, 2008, the entire contents of which are incorporated herein by reference.

BACKGROUND

1. Technical Field

The present invention relates generally to display devices and, more particularly, to a thin film transistor, a method of manufacturing the thin film transistor, and an organic light emitting device including the the thin film transistor.

2. Related Art

In display devices generally, a plurality of pixels are arranged in a matrix form, and images are displayed by controlling the light intensity of each pixel according to given luminance information. Among the various types of display devices, an organic light emitting display is a self-emission type and has low power consumption, a wide viewing angle, and a fast pixel response speed. Accordingly, the organic light emitting display is receiving attention as a next-generation display device to surpass the liquid crystal display (LCD).

For the organic light emitting display device, each pixel includes a light-emitting device, a driving transistor for driving the light emitting device, and a switching transistor for applying a data voltage to the driving transistor. The driving transistor generally is a thin film transistor (TFT) that may be classified, for example, as a poly-crystalline silicon (also referred to as "polysilicon") thin film transistor or an amorphous silicon thin film transistor, according to the kind of active layer in the thin film transistor.

For polysilicon thin film transistors, a polysilicon layer is formed, an ohmic contact layer is formed thereon, and a crystallinity process is generally executed. In the crystallinity process of this structure, the impurity of the ohmic contact layer is diffused into the semiconductor, and is present in the channel region of the semiconductor. This impurity generates a leakage current, thereby deteriorating the electrical characteristics of the thin film transistor and leading to the appearance of a stain when manufacturing the display device including the thin film transistor.

The above information disclosed in this Background section is only for enhancement of understanding of the background of the invention and therefore it may contain information that does not form the prior art that is already known in this country to a person of ordinary skill in the art.

SUMMARY

One or more embodiments of the present invention may prevent impurity from being diffused into the channel region of a thin film transistor such that leakage current is not generated.

A thin film transistor according to an embodiment of the present invention includes: an insulation substrate; a gate electrode formed on the substrate; a gate insulating layer formed on the gate electrode; a semiconductor formed on the gate insulating layer and having a pair of openings facing each other; ohmic contact layers formed in the openings and including a conductive impurity; and a source electrode and a drain electrode in contact with their respective ohmic contact layers.

The semiconductor may include an extrinsic region disposed adjacent to the ohmic contact layer and including the same impurity as that of the ohmic contact layer. The extrinsic region of the semiconductor may have the impurity at a lower concentration than that of the ohmic contact layer. The extrinsic region of the semiconductor may have a width of less than $1/100$ of the width of the semiconductor between the ohmic contact layers.

A thin film transistor according to another embodiment of the present invention includes: an insulation substrate; a gate electrode formed on the substrate; a gate insulating layer formed on the gate electrode; a pair of ohmic contact layers formed on the gate insulating layer; a semiconductor including a pair of extrinsic regions formed on the ohmic contact layers and an intrinsic region connected between the extrinsic regions; and a source electrode and a drain electrode formed on the extrinsic regions.

The impurity concentration of the extrinsic regions may be less than the impurity concentration of the ohmic contact layer. The impurity concentration of the extrinsic region be decrease as distance from the ohmic contact layers increases. The impurity of the extrinsic region may be the same material as the impurity of the ohmic contact layer. The extrinsic region may further include a side extrinsic region formed adjacent to the side surface of the ohmic contact layer. The width of the side extrinsic region may be not over $1/100$ of the width of the semiconductor disposed between the ohmic contact layers.

A method of manufacturing a thin film transistor according to an embodiment of the present invention includes: forming a gate electrode on a substrate; forming a gate insulating layer on the gate electrode; forming a pair of first amorphous patterns each including a conductive impurity and facing each other on the gate insulating layer; forming an amorphous silicon layer on the first amorphous patterns; etching the amorphous silicon layer for the first amorphous pattern to form a second amorphous pattern; crystallizing the first and second amorphous patterns to respectively form ohmic contact layers and a semiconductor; and forming a source electrode and a drain electrode contacting the ohmic contact layers.

The first amorphous pattern may be formed with a thickness of more than 1000 Å. The amorphous silicon layer may be formed with a thickness of 300-600 Å. The second amorphous pattern may have a wider width than that of the first amorphous pattern. The conductive impurity may be phosphorus (P).

A method of manufacturing a thin film transistor according to another embodiment of the present invention includes: forming a gate electrode on a substrate; forming a gate insulating layer on the gate electrode; forming a pair of first amorphous patterns including a conductive impurity and facing each other on the gate insulating layer; forming a second amorphous pattern on the first amorphous patterns by depositing and patterning an amorphous silicon layer; crystallizing the first and second amorphous patterns to respectively form ohmic contact layers and a semiconductor; and forming a source electrode and a drain electrode contacting the semiconductor of a portion overlapping the ohmic contact layers.

The conductive impurity included in the first amorphous patterns may be diffused into the second amorphous pattern in the crystallizing of the first and second amorphous patterns to respectively form ohmic contact layers and a semiconductor.

The thickness of the second amorphous pattern may be less than 600 Å. The conductive impurity may be phosphorus (P).

In accordance with one or more embodiments, the ohmic contact layer may be formed before the semiconductor is formed and the crystallization is executed. Thus, the impurity of the semiconductor is prevented from being diffused into an intrinsic region such that the leakage current may be reduced. Accordingly, the display quality of the display device may be improved.

DETAILED DESCRIPTION

Figure 1:
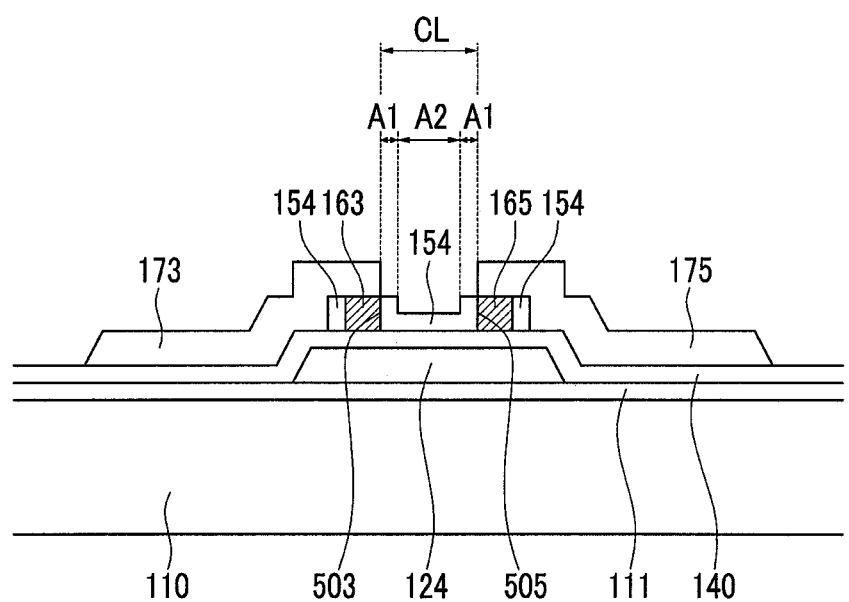
FIG. 1 is a cross-sectional view of a thin film transistor according to an embodiment of the present invention.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In the drawings, the thickness, for example, of layers, films, panels, and regions, may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

EXAMPLE ONE

A thin film transistor will now be described with reference to FIG. 1. FIG. 1 is a cross-sectional view of a thin film transistor according to an embodiment of the present invention.

As shown in FIG. 1, a buffer layer 111 made of silicon oxide ($SiO_2$) is formed on an insulation substrate 110 made of transparent glass or plastic. A gate electrode 124 is formed on the buffer layer 111. The gate electrode 124 may be made of a refractory metal such as a molybdenum-containing metal including molybdenum (Mo) or a molybdenum alloy, a chromium-containing metal including chromium (Cr) or a chromium alloy, a titanium-containing metal including titanium (Ti) or a titanium alloy, a tantalum-containing metal including tantalum (Ta) or a tantalum alloy, and a tungsten-containing metal including tungsten (W) or a tungsten alloy, or of a metal having low resistance such as aluminum (Al), copper (Cu), and silver (Ag).

A gate insulating layer 140 made of silicon oxide ($SiO_2$) or silicon nitride (SiNx) is formed on the gate electrode 124. A semiconductor 154 and ohmic contact layers 163 and 165 that are made of a crystalline silicon such as microcrystalline silicon or polycrystalline silicon are formed on the gate insulating layer 140. The semiconductor 154 includes a pair of openings 503 and 505 that are separated from each other with respect to the gate electrode 124.

The ohmic contact layers 163 and 165 are disposed in the openings 503 and 505. The ohmic contact layers 163 and 165 include a conductive impurity such as phosphorus (P). The semiconductor 154 adjacent to the ohmic contact layers 163 and 165 includes extrinsic regions A1 including the same impurity as that of the ohmic contact layers 163 and 165. The impurity concentration of the extrinsic region A1 is less than that of the ohmic contact layers 163 and 165, and the width of the extrinsic region A1 is less than $1/100$ of the width of the semiconductor 154 disposed between the ohmic contact layers 163 and 165. Also, the semiconductor 154 includes an intrinsic region A2 that is disposed between the extrinsic regions A1 and does not include the same impurity as that of the ohmic contact layers 163 and 165.

A source electrode 173 and a drain electrode 175 are formed on, respectively, the ohmic contact layers 163 and 165. The source electrode 173 and drain electrode 175 may be made of a refractory metal or a metal having low resistance such as aluminum (Al), copper (Cu), or silver (Ag), and may be formed of a multilayer of molybdenum (Mo)/aluminum (Al)/molybdenum (Mo) as well as of a singular layer.

A method for manufacturing a thin film transistor will now be described with reference to FIG. 2 through FIG. 5 as well as with reference to FIG. 1. FIG. 2 through FIG. 5 are cross-sectional views sequentially showing the manufacturing process of a thin film transistor according to one or more embodiments of the present invention.

Figure 2:
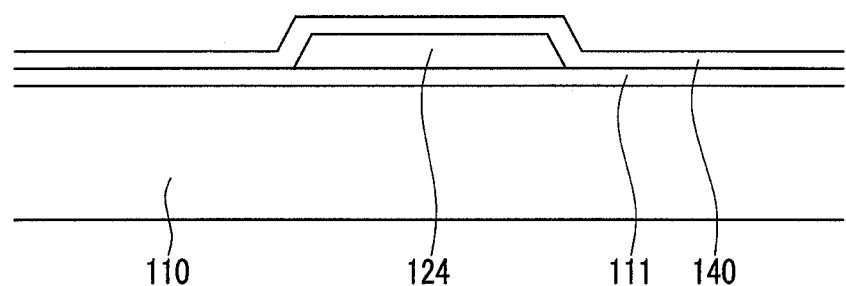
FIG. 2 through FIG. 5 are cross-sectional views sequentially showing the manufacturing process of a thin film transistor according to one or more embodiments of the present invention.

As shown in FIG. 2, an insulation substrate 110 is pre-compacted. The pre-compaction involves previously heat-treating the substrate at a temperature of about 500 to 800° C. such that it is pre-expanded and pre-contracted. The pre-compaction process can reduce expansion or contraction of the substrate during a solid phase crystallization process, thereby reducing misalignment during the solid crystallization process. Next, a buffer layer 111 of silicon oxide or silicon nitride is formed on the substrate 110. Next, a conductive material is deposited on the buffer layer 111, and is patterned to form a gate electrode 124. Next, a gate insulating layer 140 of silicon oxide or silicon nitride is formed on the gate electrode 124.

Figure 3:
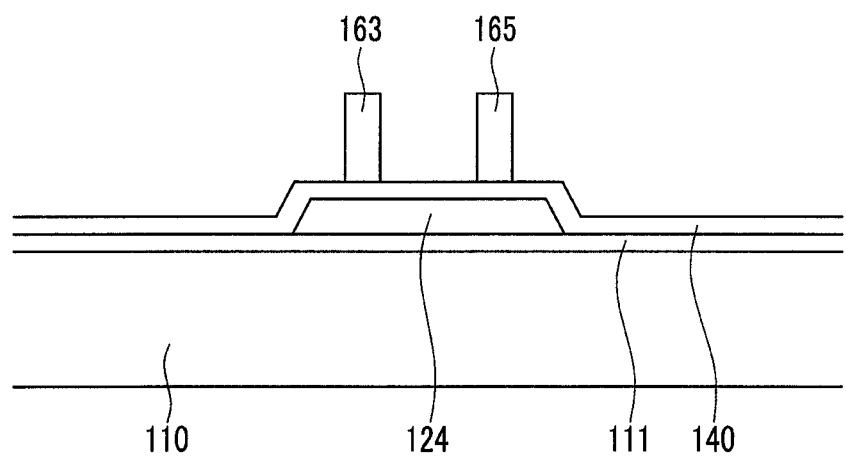

Next, as shown in FIG. 3, a first amorphous silicon layer including a conductive impurity such as phosphorus (P) at a high concentration is deposited on the gate insulating layer 140, and is patterned to form ohmic contact layers 163 and 165. The thickness of the first amorphous silicon is more than 1000 Å, and it is formed through chemical vapor deposition.

Figure 4:
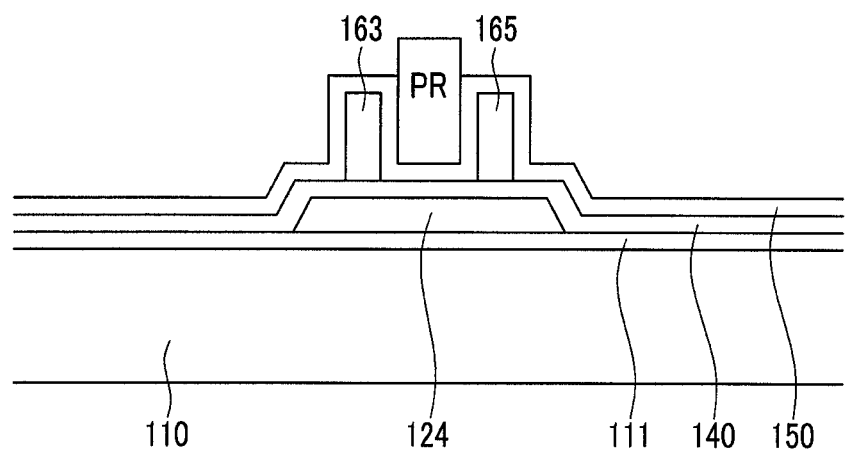

Next, as shown in FIG. 4, a second amorphous silicon layer 150 that does not include the impurity is formed on the ohmic contact layers 163 and 165. The second amorphous silicon layer 150 has a thickness that is thinner than that of the first amorphous silicon layer, and is in a range of 300-600 Å. Next, a photosensitive film pattern PR is formed on the second amorphous silicon layer 150. The photosensitive film pattern PR is disposed on a portion A2 (see FIG. 1) corresponding to a channel between the ohmic contact layers 163 and 165.

Figure 5:
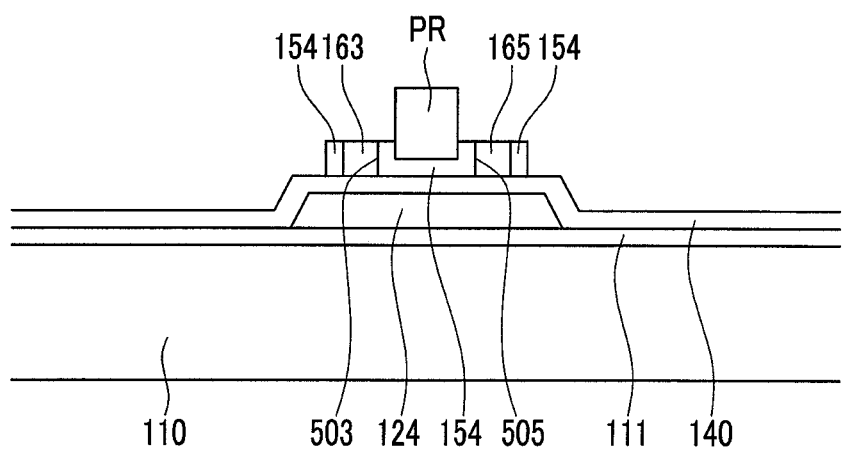

Next, as shown in FIG. 5, the second amorphous silicon layer 150 is etched by using the photosensitive film pattern PR as an etch mask for the ohmic contact layers 163 and 165 to be exposed and form a semiconductor 154. As seen in FIG. 5, the second amorphous silicon layer 150 is over-etched such that it does not remain on the ohmic contact layers 163 and 165, and the upper portion of the ohmic contact layers 163 and 165 may be removed.

Next, as shown in FIG. 1, the photosensitive film pattern PR is removed, and a crystallization process is executed to crystallize the semiconductor 154 and the ohmic contact layers 163 and 165. For the crystallization, solid phase crystallization (SPC), liquid phase recrystallization (LPR), or excimer laser annealing (ELA) may be used, and it is preferable that the solid phase crystallization is used because of its ease in crystallization of a large area. The solid phase crystallization may be executed through heat treatment in the range of about 500 to 750° C., and heat treatment of field-enhanced rapid thermal annealing (FERTA) may be executed in the range of about 690 to 705° C.

During the crystallization, the impurity of the ohmic contact layers 163 and 165 may be diffused into the semiconductor 154 such that an extrinsic region A1 having a lesser concentration than that of the ohmic contact layers 163 and 165 is formed. The extrinsic region A1 is formed through the diffusion of the impurity from the ohmic contact layer 163 and 165 during the crystallization, and the diffusion distance from the ohmic contact layers 163 and 165 is not over 1/100 of the length CL of the semiconductor 154 between the ohmic contact layers 163 and 165. Next, a conductive material is deposited and patterned to form a source electrode 173 and a drain electrode 175 that contact the ohmic contact layers 163 and 165.

In an embodiment of the present invention, the ohmic contact layers 163 and 165 and, then, the semiconductor 154 may be formed such that diffusion of the impurity from the ohmic contact layers 163 and 165 into the channel region of the semiconductor 154 may be minimized, and thus, leakage current due to the impurity remaining in the channel region is not generated.

EXAMPLE TWO

Figure 6:
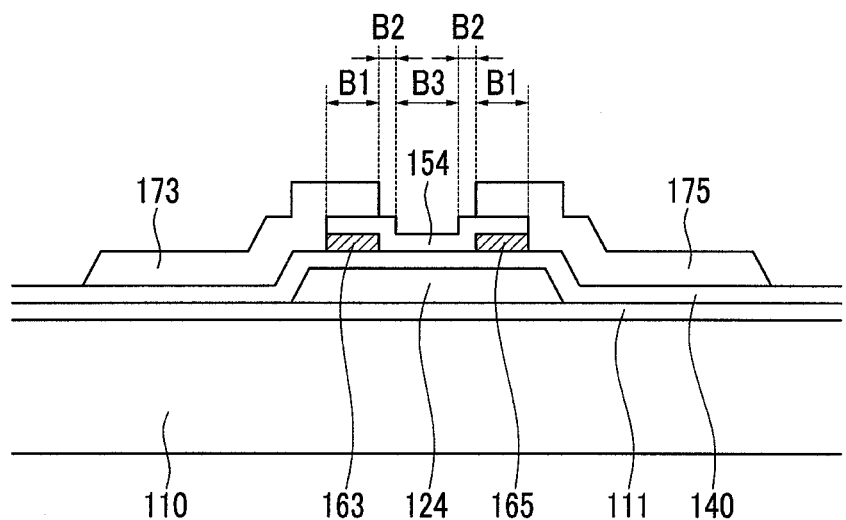
FIG. 6 is a cross-sectional view of a thin film transistor according to another embodiment of the present invention.

FIG. 6 is a cross-sectional view of a thin film transistor according to another embodiment of the present invention. As shown in FIG. 6, a buffer layer 111 made of silicon oxide is formed on an insulation substrate 110 made of transparent glass or plastic. A gate electrode 124 is formed on the buffer layer 111, and a gate insulating layer 140 is formed on the gate electrode 124. Ohmic contact layers 163 and 165 are formed in pairs on the gate insulating layer 140, and are opposite to each other with respect to the gate electrode 124.

A semiconductor 154 is formed on ohmic contact layers 163 and 165 including the portion (e.g., of gate insulating layer 140) between the ohmic contact layers 163 and 165. The semiconductor 154 may be made of microcrystalline silicon or polysilicon, and the ohmic contact layers 163 and 165 may include the conductive impurity such as phosphorus (P). The semiconductor 154 includes extrinsic regions B1 and B2 including the same conductive impurity as that of the ohmic contact layers 163 and 165, and the impurity concentration of the extrinsic regions B1 and B2 is less than that of the ohmic contact layers 163 and 165.

The extrinsic regions B1 and B2 are formed in the first region B1 and the second region B2 of the semiconductor 154 that contact the ohmic contact layers 163 and 165. The first regions B1 overlap their respective ohmic contact layers 163 and 165 and on the ohmic contact layers 163 and 165. The second regions B2 are edge portions of the semiconductor 154 adjacent to their respective ohmic contact layers 163 and 165. The width of the second region B2 is the same as the thickness of the semiconductor 154 and is not over 1/100 of the length (B2+B3+B2) of the semiconductor 154 between the ohmic contact layers 163 and 165. The thickness of the semiconductor 154 may be less than 600 Å.

Also, the semiconductor 154 includes an intrinsic region B3 that is disposed between the second regions B2, and does not include the conductive impurity. In this example, the ohmic contact layers 163 and 165 and the semiconductor 154 may be comprehended as one semiconductor classified by the concentration of the conductive impurity. That is, the region corresponding to the ohmic contact layers 163 and 165 is a region having the highest concentration of the conductive impurity, the combination of the first regions B1 neighboring the ohmic contact layers 163 and 165 and the second regions B2 is a region having a lesser concentration of the conductive impurity than that of the ohmic contact layers 163 and 165, and the intrinsic region B3 is a region that includes almost no conductive impurity. The concentration of the conductive impurity of the first region B1 and the second region B2 is gradually decreased according to an increase of distance from the ohmic contact layers 163 and 165, and the conductive impurity is distributed to the upper surface of the first region B1.

A pair of a source electrode 173 and a drain electrode 175 that are separated from each other with respect to the gate electrode 124 are formed on the semiconductor 154.

Figure 7:
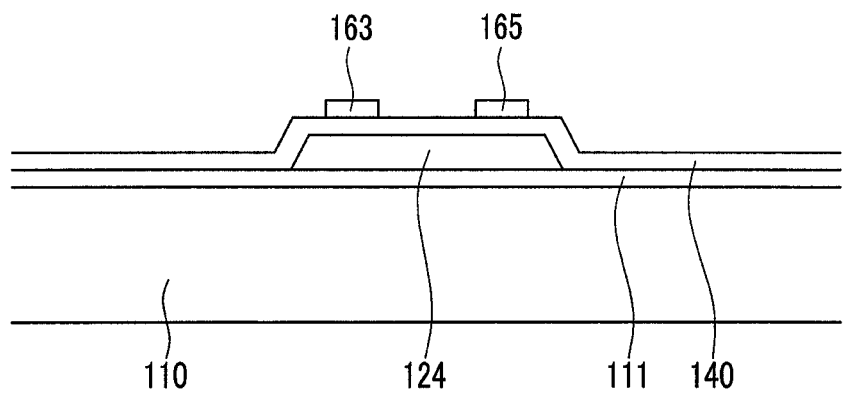
FIG. 7 and FIG. 8 are cross-sectional views sequentially showing the manufacturing process of a thin film transistor according to another embodiment of the present invention.
Figure 8:
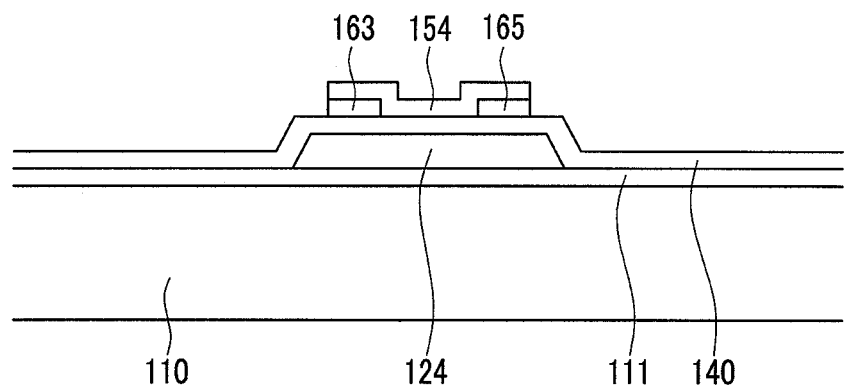
Figure 9:
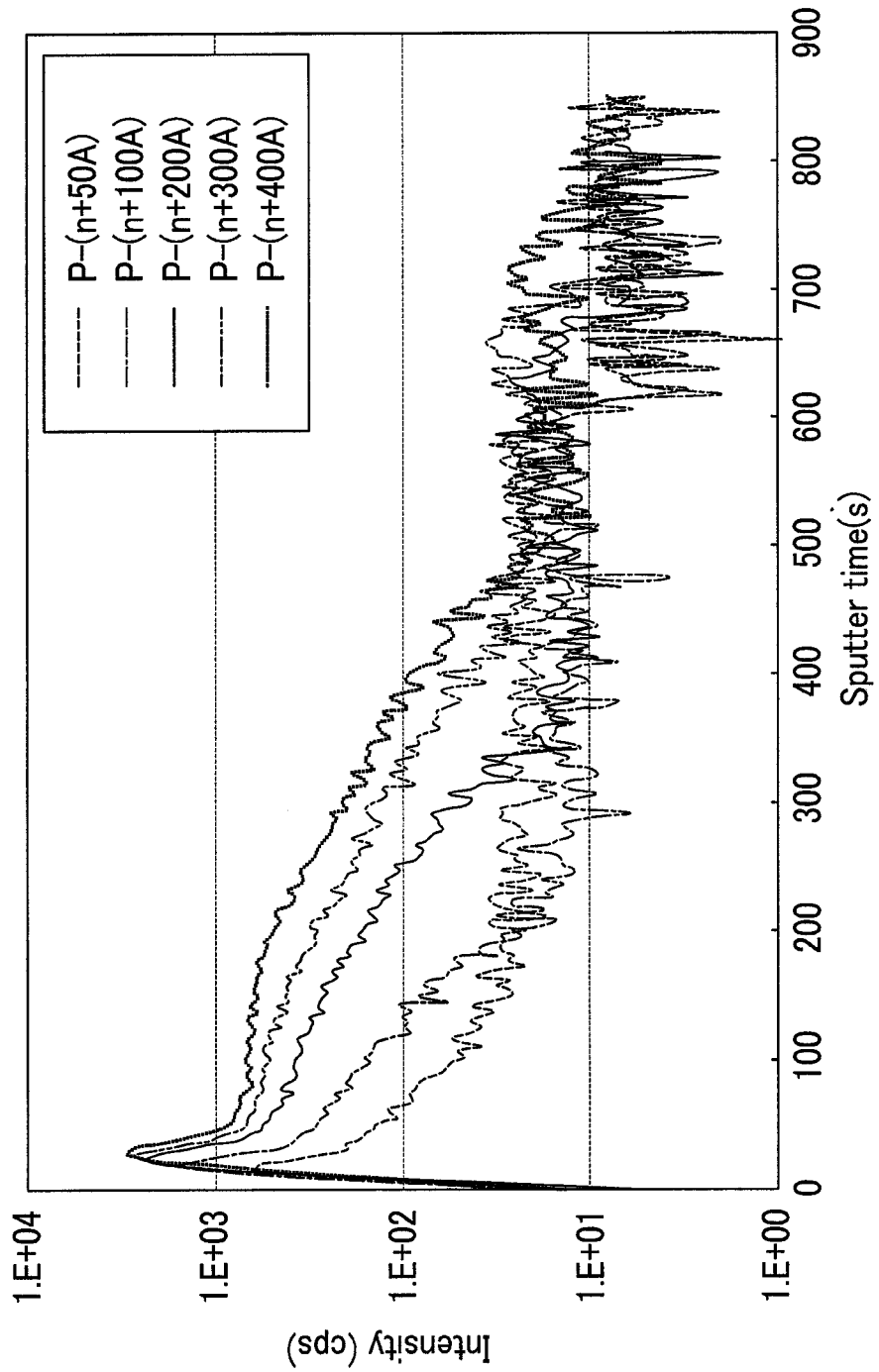
FIG. 9 shows phosphorus content according to depth under a crystalline layer.

A method for manufacturing a thin film transistor will now be described with reference to FIGS. 7, 8, and 9, as well as with reference to FIG. 6. FIG. 7 and FIG. 8 are cross-sectional views sequentially showing the manufacturing process of a thin film transistor according to another embodiment of the present invention, and FIG. 9 shows a content of phosphorus according to depth under a crystalline layer.

As shown in the previously-described FIGS. 2 and 3, an insulation substrate 110 is pre-compacted, and a buffer layer 111, a gate electrode 124, and a gate insulating layer 140 are formed on the insulation substrate 110. Next, as shown in FIG. 7, a first amorphous silicon layer including a conductive impurity such as phosphorus (P) with a high concentration is deposited on the gate insulating layer 140, and is patterned to form ohmic contact layers 163 and 165. The first amorphous silicon layer is formed with a thickness of less than 600 Å, which is different from the example embodiment illustrated above.

Next, as shown in FIG. 8, a second amorphous silicon layer that does not include the conductive impurity is formed on the ohmic contact layers 163 and 165, and is patterned to form a semiconductor 154. The thickness of the second amorphous silicon is in a range of less than 600 Å.

Next, as shown in FIG. 6, a crystallization process is executed to crystallize the semiconductor 154 and the ohmic contact layers 163 and 165. The crystallization process may be executed as in FIG. 1.

In this example, the impurity of the ohmic contact layers 163 and 165 is diffused into the semiconductor 154 such that extrinsic regions B1 and B2 are formed. Accordingly, the concentration of the conductive impurity of the first region B1 and the second region B2 may be further decreased from that of the ohmic contact layers 163 and 165. Also, the thickness of the semiconductor 154 is less than 600 Å such that the impurity may be diffused to the upper surface of the first region B1.

Next, a conductive material is deposited and patterned to form a source electrode 173 and a drain electrode 175 contacting the extrinsic region B1 of the semiconductor 154. In this example, if the source electrode and the drain electrode directly contact the semiconductor, the ohmic contact layers 163, 165 may but need not be formed.

In this example, the impurity of the ohmic contact layers 163 and 165 is also diffused to the channel region thereby forming an extrinsic region B2, however, the width of the extrinsic region B2 is shorter compared with the length of the entire channel such that the intrinsic region B3 for acting as the channel may be sufficiently obtained.

In embodiments of the present invention, the semiconductor (e.g., semiconductor layer 154) is formed after forming the ohmic contact layer (e.g., ohmic contact layers 163, 165) such that it is easy to form the intrinsic region (e.g., A2 or B3) such that the impurity diffused from the ohmic contact layer does not reach the intrinsic region. Accordingly, the leakage current due to impurity of the channel region may not be generated.

EXAMPLE THREE

A thin film transistor according to one or more embodiments may be used as a driving thin film transistor and a switching thin film transistor of an organic light emitting device. Organic light emitting devices, in accordance with one or more embodiments, including the thin film transistors shown in FIG. 1 and FIG. 6 will be described with reference to the accompanying drawings.

Figure 10:
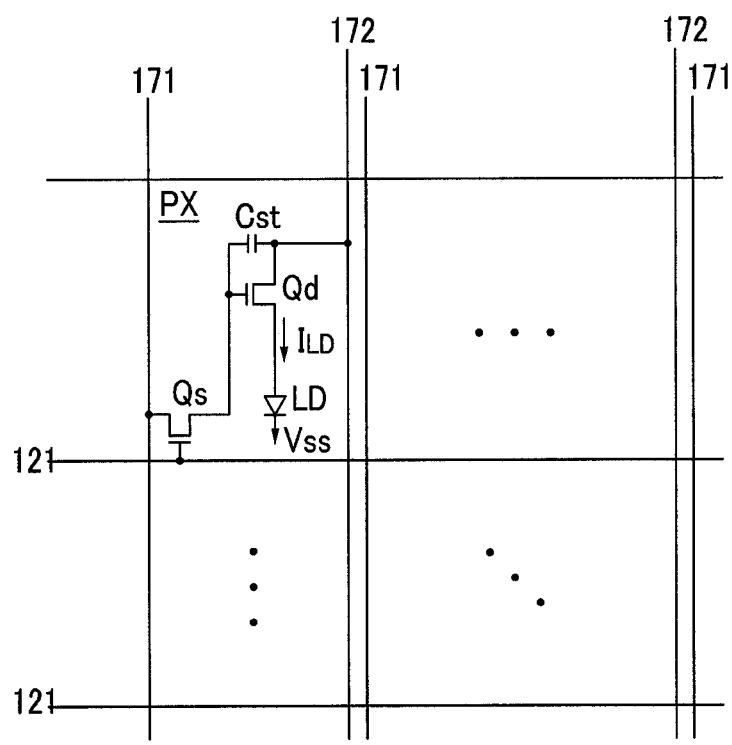
FIG. 10 is an equivalent circuit diagram of an organic light emitting device according to an embodiment of the present invention.

FIG. 10 is an equivalent circuit diagram of an organic light emitting device according to an embodiment of the present invention. As shown in FIG. 10, an organic light emitting device according to the present example includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, and the data lines 171 and the driving voltage lines 172 extend substantially in a column direction and substantially parallel to each other.

Each pixel PX includes a switching transistor Qs, a driving transistor Qd, a storage capacitor Cst, and an organic light emitting diode (OLED) LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting diode LD. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting diode LD has an anode connected to the output terminal of the driving transistor Qd and a cathode connected to a common voltage Vss. The organic light emitting diode LD emits light having an intensity depending on an output current ILD of the driving transistor Qd, thereby displaying images.

The switching transistor Qs and the driving transistor Qd are n-channel field effect transistors (FETs). However, at least one of the switching transistor Qs and the driving transistor Qd may be a p-channel FET. In addition, the connections among the transistors Qs and Qd, the capacitor Cst, and the organic light emitting diode LD may be modified.

Figure 11:
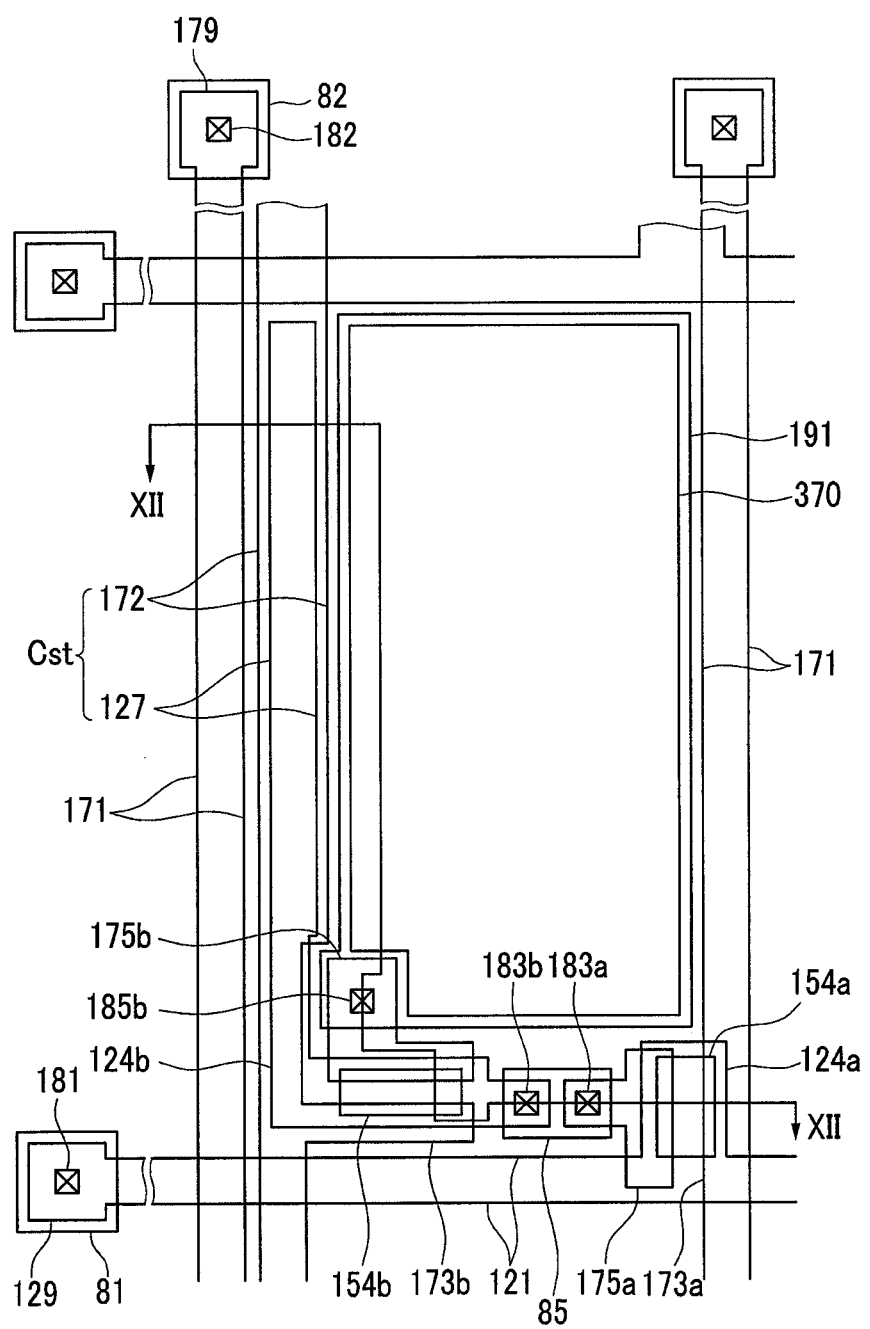
FIG. 11 is a layout view of an organic light emitting device according to an embodiment of the present invention.
Figure 12:
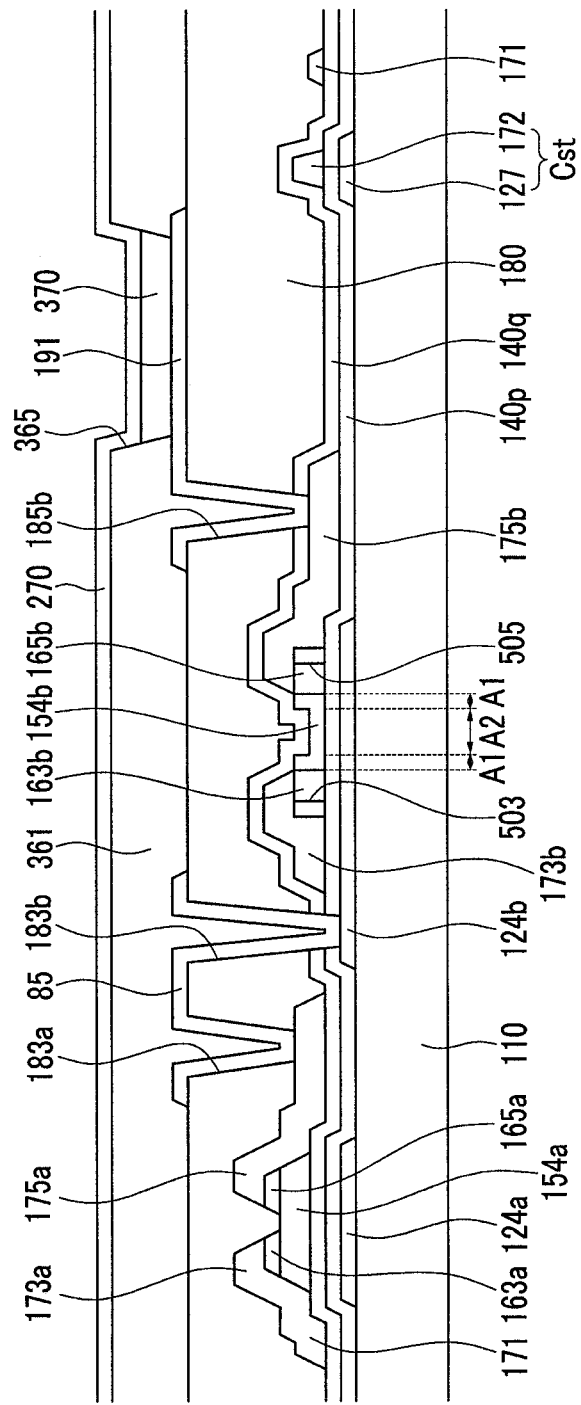
FIG. 12 is a cross-sectional view of the organic light emitting device shown in FIG. 11 taken along the line XII-XII, according to an embodiment of the present invention.

The detailed structure of the organic light emitting device shown in FIG. 10 will now be described with reference to FIG. 11 and FIG. 12 as well as with reference to FIG. 10. Specifically, FIG. 11 is a layout view of an organic light emitting device according to an embodiment of the present invention, and FIG. 12 is a cross-sectional view of the organic light emitting device shown in FIG. 11 taken along the line XII-XII.

A plurality of gate lines 121 including a plurality of switching control electrodes 124a, and a plurality of driving control electrodes 124b are formed on an insulating substrate 110. Each gate line 121 extends according to one direction, and includes a plurality of switching control electrodes 124a that are protruded upward and an end portion 129 for connection with a different layer or an external driving circuit.

The driving control electrodes 124b are separated from the gate lines 121 and include a plurality of storage electrodes 127 extending upward. The gate lines 121 and the driving control electrodes 124b may be formed with the same material as the gate electrodes 124 of FIG. 1.

A driving gate insulating layer 140p is formed on the gate lines 121 and the driving control electrodes 124b. Driving ohmic contact layers 163b and 165b, and a driving semiconductor 154b overlapping the driving control electrode 124b are formed on the driving gate insulating layer 140p. The driving ohmic contact layers 163b and 165b and the driving semiconductor 154b may be made of crystalline silicon such as microcrystalline silicon or polysilicon.

The driving semiconductor 154b includes a pair of openings 503 and 505 that are separated from each other with respect to the gate electrode 124b, and the driving ohmic contact layers 163b and 165b are formed in the openings 503 and 505.

The driving ohmic contact layers 163b and 165b include a conductive impurity such as phosphorus (P). The driving semiconductor 154b adjacent to the driving ohmic contact layers 163b and 165b includes an extrinsic region A1 including the same impurity as the driving ohmic contact layers 163b and 165b. The impurity concentration of the extrinsic region A1 is less than that of the driving ohmic contact layers 163b and 165b, and the width of the extrinsic region A1 is less than 1/100 of the width of the driving semiconductor 154b disposed between the driving ohmic contact layers 163b and 165b. Also, the driving semiconductor 154b includes an intrinsic region A2 that does not include the same impurity as the driving ohmic contact layers 163b and 165b between the extrinsic regions A1. The channel of the driving thin film transistor is formed in the intrinsic region A2.

A plurality of driving voltage lines 172 including a plurality of driving input electrodes 173b, and plurality of driving output electrodes 175b are formed on the driving semiconductors 154b and the driving gate insulating layer 140p. The driving voltage lines 172 transmit driving voltages and extend in a vertical direction while intersecting the gate lines 121. Each driving voltage line 172 includes a plurality of driving input electrodes 173b extending toward the driving semiconductor 154b, and the portions of the driving voltage lines 172 overlap the storage electrodes 127 of the driving control electrodes 124b thereby forming the storage capacitor Cst.

The driving output electrodes 175b are separated from the driving voltage lines 172 and have an island shape. The driving input electrodes 173b and the driving output electrodes 175b are disposed, respectively, on the ohmic contact layers 163b and 165b of the driving semiconductor 154b, and are opposite to each other with respect to the intrinsic region A2 of the driving semiconductor 154b. The driving voltage lines 172 and the driving output electrodes 175b may be formed with the same material as the source electrodes and drain electrodes of FIG. 1.

A switching gate insulating layer 140q is formed on the driving voltage lines 172 and the driving output electrodes 175b. A plurality of switching semiconductors 154a overlapping the switching control electrodes 124a are formed on the switching gate insulating layer 140q. The switching semiconductors 154a are made of amorphous silicon.

A pair of ohmic contact layers 163a and 165a are formed on the switching semiconductors 154a. The ohmic contact layers 163a and 165a may be made of amorphous silicon doped with an n-type or p-type impurity with a thickness of about 500 Å.

A plurality of data lines 171 including a plurality of switching input electrodes 173a, and a plurality of switching output electrodes 175a are formed on the ohmic contact layers 163a and 165a and the switching gate insulating layer 140q. The data lines 171 transmit data signals and extend in a vertical direction while intersecting the gate lines 121. The portions of the data lines 171 overlapping the switching semiconductors 154a form switching input electrodes 173a. The switching output electrodes 175a are opposite to the switching input electrodes 173a on the switching semiconductors 154a. The data lines 171 including the switching input electrodes 173a and the switching output electrodes 175a may be formed with the same material as the driving voltage lines 172 and the driving output electrodes 175b.

A passivation layer 180 is formed on the data lines 171 and the switching output electrodes 175a. The passivation layer 180 may be made of an inorganic material such as silicon oxide or silicon nitride, or of an organic material such as poly-acryl. The passivation layer 180 has a plurality of contact holes 182 and 183a exposing, respectively, the end portions 179 of the data lines 171 and the switching output electrodes 175a. The passivation layer 180 and the switching gate insulating layer 140q have a plurality of contact holes 185b exposing the driving output electrodes 175b. The passivation layer 180, the switching gate insulating layer 140q, and the driving gate insulating layer 140p have a plurality of contact holes 183b and 181 exposing, respectively, the driving control electrodes 124b and the end portions 129 of the gate lines 121.

A plurality of pixel electrodes 191, a plurality of connecting members 85, and a plurality of contact assistants 81 and 82 are formed on the passivation layer 180. The pixel electrodes 191 are electrically connected to the driving output electrodes 175b through the contact holes 185b, and may be made of a transparent conductor such as ITO or IZO. The connecting members 85 connect the switching output electrodes 175a and the driving control electrodes 124b to each other through the contact holes 183a and 183b, respectively. The contact assistants 81 and 82 are connected, respectively, to the end portions 129 and 179 of the gate lines 121 and the data lines 171 through the contact holes 181 and 182. The contact assistants 81 and 82 enhance the adhesion between the end portions 129 and 179 of the gate lines 121 and the data lines 171, and an external device, and protect them.

An organic insulator 361 is formed on the pixel electrodes 191 and the connecting members 85. The organic insulator 361 has a plurality of openings 365 enclosing the edges of the pixel electrodes 191 like an embankment.

A plurality of organic light emitting members 370 are formed in the openings 365. The organic light emitting members 370 may be made of a multi-layered structure including an auxiliary layer (not shown) for improving light emitting efficiency, as well as light emission layers. Each of the light emitting members 370 may be made of a low molecular material or a high molecular material, or a mixture thereof, that uniquely emits light of one primary color such as red, green, or blue. The auxiliary layers may include an electron transport layer (not shown) and a hole transport layer (not shown) for improving the balance of electrons and holes, and an electron injecting layer (not shown) and a hole injecting layer (not shown) for improving the injection of electrons and holes.

The light emitting members 370 uniquely emitting light of one of the primary colors such as red, green, and blue may be arranged, respectively, in each pixel, and the light emitting members 370 emitting light of three colors such as red, green, and blue may all be arranged in one pixel with a vertical or horizontal deposition to form a white emitting layer under or above the color filters emitting light of one of the primary colors such as red, green, and blue. Also, a four-color structure including red, green, blue, and white pixels may be arranged with a stripe or check shape to improve the luminance, as well as the three color structure including red, green, and blue pixels.

A common electrode 270 is formed on the organic light emitting members 370. The common electrode 270 is disposed on the whole surface of the substrate, and may be formed of an opaque conductor such as Au, Pt, Ni, Cu, W, or alloys thereof. The common electrode 270 supplies current to the light emitting members 370 in cooperation with the pixel electrodes 191. In this organic light emitting device, a pixel electrode 191, a light emitting member 370, and the common electrode 270 form an organic light emitting diode LD having the pixel electrode 191 as an anode and the common electrode 270 as a cathode, or vice versa.

In the above-described embodiment of the present invention, the semiconductor of the driving thin film transistor may be made of crystalline silicon such that high carrier mobility, stability, and uniformity for flowing sufficient current to the organic light emitting device may be obtained. Also, the semiconductor may be formed on the ohmic contact layer, and the intrinsic region that does not include the impurity of the ohmic contact layer may be formed such that leakage current is not generated, thus increasing the amount of current to the light-emitting device and increasing the luminance.

On the other hand, since the switching thin film transistor controls the data voltage, the on/off characteristics of the switching thin film transistor are important. Particularly, it may be important to reduce the off current. The microcrystalline or polycrystalline semiconductor, however, has a large current such that the data voltage across a switching thin film transistor may be reduced and crosstalk may be generated. Accordingly, the switching thin film transistor includes the amorphous semiconductor having a small current in a present embodiment such that the reduction of the data voltage may be prevented and the crosstalk may be reduced.

The switching thin film transistor of the organic light emitting device shown in FIG. 11 and 12, however, may be formed like the thin film transistor shown in FIG. 1 if necessary. Also, at least one of the driving and switching thin film transistors may be formed as the thin film transistor shown in FIG. 6.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor comprising:
    an insulation substrate;
    a gate electrode formed on the substrate;
    a gate insulating layer formed on the gate electrode;
    a semiconductor formed on the gate insulating layer and having a pair of openings;
    ohmic contact layers formed in the openings and including a conductive impurity; and
    a source electrode and a drain electrode contacting the ohmic contact layers,
    wherein the semiconductor includes an extrinsic region disposed adjacent to the ohmic contact layer and including the same impurity as that of the ohmic contact layer; and
    wherein the extrinsic region of the semiconductor has a width less than 1/100 of a width of the semiconductor between the ohmic contact layers.

2. The thin film transistor of claim 1, wherein the extrinsic region of the semiconductor has the impurity at a lower concentration than that of the ohmic contact layer.

3. The thin film transistor of claim 1, wherein the semiconductor is made of a crystalline silicon.

* * * * *